(12) United States Patent
Maeda et al.

(10) Patent No.: US 6,190,787 B1
(45) Date of Patent: Feb. 20, 2001

(54) EPOXY RESIN COMPOSITIONS FOR ENCAPSULATING SEMICONDUCTORS, AND SEMICONDUCTOR DEVICES

(75) Inventors: Masakatu Maeda, Utsunomiya; Shinichi Iwasaki, Nogata, both of (JP)

(73) Assignee: Sumitomo Bakelite Company, Ltd., Tokyo (JP)

( * ) Notice: Under 35 U.S.C. 154(b), the term of this patent shall be extended for 0 days.

(21) Appl. No.: 09/242,938

(22) PCT Filed: Jul. 2, 1998

(86) PCT No.: PCT/JP98/02980

§ 371 Date: Feb. 26, 1999

§ 102(e) Date: Feb. 26, 1999

(87) PCT Pub. No.: WO99/01507

PCT Pub. Date: Jan. 14, 1999

(30) Foreign Application Priority Data

Jul. 2, 1997 (JP) .................................................. 9-177167
Apr. 22, 1998 (JP) ............................................... 10-112134

(51) Int. Cl.[7] .................................................... H01L 29/12
(52) U.S. Cl. ......................... 428/620; 523/210; 523/216; 523/458; 523/459
(58) Field of Search ...................................... 523/216, 458, 523/459, 210; 428/620; 524/493, 789; 252/609, 610

(56) References Cited

U.S. PATENT DOCUMENTS 4,101,497 * 7/1978 Charves et al. .................. 260/31.2 N
4,328,152 5/1982 Tsigdinos et al. .

FOREIGN PATENT DOCUMENTS

| 57-121044 | 7/1982 | (JP) . |
| 60-080259 | * 5/1985 | (JP) . |
| 60-179442 | 9/1985 | (JP) . |
| 8-259852 | 10/1996 | (JP) . |
| 9-25377 | 1/1997 | (JP) . |

* cited by examiner

*Primary Examiner*—Robert Dawson
*Assistant Examiner*—D. Aylward
(74) *Attorney, Agent, or Firm*—Frishauf, Holtz, Goodman, Langer & Chick, P.C.

(57) ABSTRACT

An epoxy resin composition for sealing semiconductors which does not contain any halogen compounds or antimony compounds, has an excellent flame retarding property and shows excellent high temperatures storage life and reliability in a humid condition, and a semiconductor device are provided. The epoxy resin composition for sealing semiconductors comprises (A) an epoxy resin, (B) a phenol resin curing agents, (C) a curing accelerator, (D) an inorganic filler and (E) zinc molybdate as the essential components and the semiconductor device is sealed with this epoxy resin composition.

24 Claims, No Drawings

EPOXY RESIN COMPOSITIONS FOR ENCAPSULATING SEMICONDUCTORS, AND SEMICONDUCTOR DEVICES

TECHNICAL FIELD

The present invention relates to an epoxy resin composition for sealing semiconductors and a semiconductor device. More particularly, the present invention relates to an epoxy resin composition for sealing semiconductors which does not contain any halogen fire retardants or antimony fire retardants and shows excellent high temperatures storage life, flame retarding property and reliability in a humid condition, and to a semiconductor device using this epoxy resin composition.

BACKGROUND ART

Heretofore, electronic parts such as diodes, transistors and integrated circuits are sealed mainly with epoxy resin compositions. The epoxy resin compositions contain fire retardants containing a halogen and an antimony compound to provide the composition with the flame retarding property. The flame retarding property of the composition is exhibited by generation of a gas of a halogen or an antimony halide at high temperatures.

However, in accordance with the above method for exhibiting the flame retarding property, a gas of a halogen or an antimony halide is generated when an electronic part is exposed to a high temperature and this causes a big problem in that corrosion of aluminum circuits and fracture of connecting portions between aluminum pads and gold wires in chips take place. Moreover, it is required for protection of the environment and the health that an epoxy resin composition which does not use any fire retardants containing a halogen or an antimony compound and exhibits an excellent flame retarding property be developed.

To overcome the above problems, a resin composition having a glass transition temperature higher than the temperature of the environment which is obtained by a combination of an epoxy resin and a phenol resin curing agent is used to decrease diffusion of a gas of a halogen or an antimony halide during storage at high temperatures and high temperatures storage life can be improved. Alternatively, an ion scavenger may be added to scavenge gases of a halogen or an antimony halide generated during storage at high temperatures. A combination of these methods may also be used.

On the other hand, recently, electronic parts are often disposed at the surface of substrates of circuits. The size of electronic parts are becoming smaller and thinner. Therefore, improvement in crack resistance is required in soldering for attachment of electronic parts to substrates of circuits. Thus, an epoxy resin composition exhibiting both of excellent crack resistance in soldering and excellent high temperatures storage life has been desired. However, even when an epoxy resin composition which contains a fire retardant of a halogen compound or a combination of a halogen compound and an antimony compound and exhibits excellent crack resistance in soldering is used, addition of an ion scavenger cannot provide sufficient high temperatures storage life when the epoxy resin composition has a low glass transition temperature. On the other hand, an epoxy resin composition shows insufficient crack resistance in soldering when the epoxy composition has a high glass transition temperature. No epoxy resin compositions which have a low glass transition temperature and exhibit excellent high temperatures storage life have been provided.

Various fire retardants other than fire retardants containing a halogen and antimony compounds have been studied. For example, metal hydroxides such as aluminum hydroxide and magnesium hydroxide and boron compounds have been studied. However, these compounds do not effectively exhibit the flame retarding property unless they are used in a large amount. Moreover, these compounds contain large amounts of impurities and reliability in a humid condition is not satisfactory. Therefore, these compounds are not practically used. Fire retardants containing red phosphorus are effective even when these fire retardants are used in small amounts and are useful for fire retardation of epoxy resin compositions. However, red phosphorus has a problem in reliability in a humid condition because red phosphorus reacts with a minute amount of water to form phosphines and corrosive phosphoric acid. An epoxy resin composition which exhibits both of the flame retarding property and the reliability in a humid condition without using a fire retardant containing a halogen or an antimony compound has been desired.

The present invention has an object to provide an epoxy resin composition for sealing semiconductors which does not contain any halogen compounds or antimony compounds, has an excellent flame retarding property and exhibits excellent high temperatures storage life and reliability in a humid condition, and to provide a semiconductor device using this epoxy resin composition.

DISCLOSURE OF THE INVENTION

As the result of extensive studies by the present inventors to achieve the above object, it was found that the long term reliability of an epoxy resin composition in a humid condition can be remarkably improved by using zinc molybdate without deterioration in the flame retarding property. The present invention has been completed on the basis of this knowledge.

Accordingly, the present invention provides:

(1) An epoxy resin composition for sealing semiconductors which comprises (A) an epoxy resin, (B) a phenol resin curing agent, (C) a curing accelerator, (D) an inorganic filler and (E) zinc molybdate as essential components;

(2) An epoxy resin composition for sealing semiconductors described in (1), wherein zinc molybdate coats an inorganic substance;

(3) An epoxy resin composition for sealing semiconductors described in (2), wherein the inorganic substance is fused spherical silica;

(4) An epoxy resin composition for sealing semiconductors described in any of (1), (2) and (3), wherein the epoxy resin is a crystalline epoxy resin represented by one of the following formulae [1], [2] and [3]:

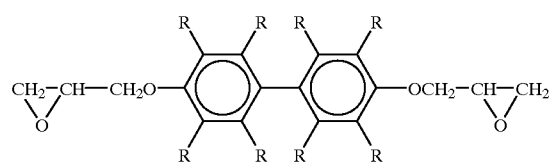

-continued

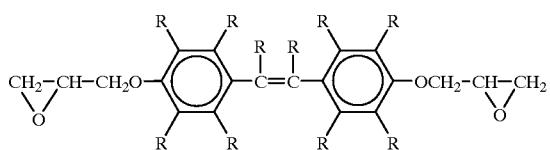

[2]

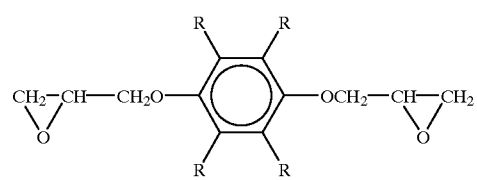

[3]

wherein R represents hydrogen atom, a halogen atom or an alkyl group having 1 to 12 carbon atoms and the plurality of R may be the same with or different from each other;

(5) An epoxy resin composition for sealing semiconductors described in any of (1), (2), (3) and (4), which further comprises an ion scavenger represented by one of the following formulae [4], [5] and [6]:

$$BiO_a(OH)_b(NO_3)_c \quad [4]$$

wherein a=0.9 to 1.1, b=0.6 to 0.8 and c=0 to 0.4

$$BiO_d(OH)_e(NO_3)_f(HSiO_3)_g \quad [5]$$

wherein d=0.9 to 1.1, e=0.6 to 0.8 and f+g=0.2 to 0.4

$$Mg_hAl_i(OH)_{2h+3i-2k}(CO_3)_k \cdot mH_2O \quad [6]$$

wherein $0<j/h\leq1$, $0\leq k/j<1.5$ and m represents a positive number; and (6) A semiconductor device sealed with an epoxy resin composition for sealing semiconductors described in any of (1), (2), (3), (4) and (5).

THE MOST PREFERRED EMBODIMENT TO CARRY OUT THE INVENTION

The epoxy resin composition for sealing semiconductors of the present invention comprises (A) an epoxy resin, (B) a phenol resin curing agents, (C) a curing accelerator, (D) an inorganic filler and (E) zinc molybdate as the essential components.

The epoxy resin of component (A) used in the composition of the present invention is not particularly limited and a monomer, an oligomer or a polymer having two or more epoxy groups in one molecule can be used. Examples of the epoxy resin include epoxy resins derived from bisphenol A, epoxy resins containing bromine, epoxy resins derived from bisphenol F, epoxy resins derived from bisphenol AD, epoxy resins derived from biphenyl, epoxy resins derived from hydroquinone, epoxy resins derived from stilbene, epoxy resins derived from phenol novolaks, epoxy resins derived from cresol novolaks, epoxy resins derived from triphenolmethane, epoxy resins derived from triphenolmethane and modified with alkyl groups, epoxy resins containing triazine cores, epoxy resins derived from phenol and modified with dicyclopentadiene, cyclic aliphatic epoxy resins, epoxy resins derived from glycidyl esters, epoxy resins derived from glycidylamines and heterocyclic epoxy resins. These epoxy resins may be used singly or as a combination of two or more types.

Among these epoxy resins, crystalline epoxy resins derived from biphenyl, hydroquinone or stilbene which are represented by the following formula [1], [2] or [3], respectively, can be preferably used:

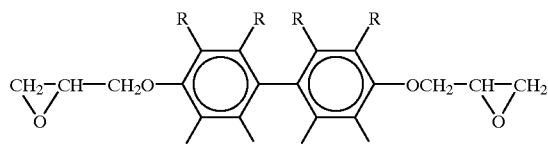

[1]

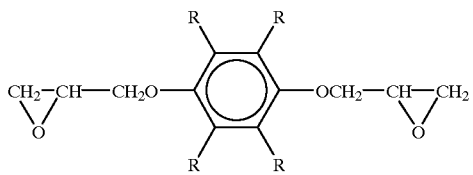

[2]

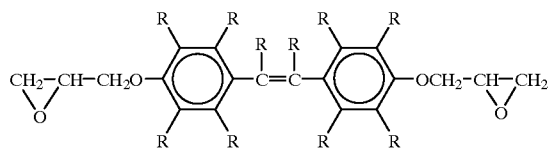

[3]

In the above formulae, R represents hydrogen atom, a halogen atom or an alkyl group having 1 to 12 carbon atoms and the plurality of R may be the same with or different from each other. The crystalline epoxy resins represented by formula [1], [2] or [3] have low viscosity and can be mixed with a large amount of inorganic fillers such as silica. Therefore, the resin composition comprising the epoxy resin shows excellent crack resistance in soldering. On the other hand, the glass transition temperature of a cured composition decreases and high temperatures storage life becomes inferior. However, the high temperatures storage life can be improved by using zinc molybdate in accordance with the present invention. Thus, excellent crack resistance in soldering and excellent high temperatures storage life can be achieved.

The phenol resin curing agent of component (B) used in the composition of the present invention is not particularly limited and a monomer, an oligomer or a polymer having two or more phenolic hydroxyl group in one molecule can be used. Examples of the phenol resin curing agent include phenol novolak resins, cresol novolak resins, phenol resins modified with dicyclopentadiene, phenol resins modified with xylylene, phenol resins modified with terpene and novolak resins derived from triphenolmethane. The phenol resin curing agents may be used singly or as a combination of two or more types. Among these phenol resin curing agents, phenol novolak resin, phenol resins modified with dicyclopentadiene, phenol resins modified with xylylene and phenol resins modified with terpene can be preferably used. The phenol resin curing agent is preferably used in an amount such that the ratio of the number of epoxy group in the epoxy resin and the number of phenolic hydroxyl group in the phenol resin curing agent is 0.8 to 1.3 in the resin composition.

The curing accelerator of component (C) used in the composition of the present invention is not particularly limited. Examples of the curing accelerator include curing accelerators of amines, curing accelerators of polyaminoamides, curing accelerators of acid anhydrides, basic active hydrogen compounds, curing accelerators containing phosphorus and imidazoles. The curing accelerators may be used singly or as a combination of two or more types. Among these curing accelerators, 1,8-diazabicyclo[5,4,0]undecene-7, triphenylphosphine and 2-methylimidazole are preferably used.

The inorganic filler of component (D) used in the composition of the present invention is not particularly limited. Examples of the inorganic filler include powder of fused silica, powder of crystalline silica, alumina and silicon nitride. The inorganic filler may be used singly or as a combination of two or more types. The amount of the inorganic filler is not particularly limited. When the balance between moldability and crack resistance in soldering is taken into consideration, it is preferable that the inorganic filler is used in an amount of 60 to 95% by weight of the total amount of the epoxy resin composition. When the amount of the inorganic filler is less than 60% by weight of the total amount of the epoxy resin composition, there is the possibility that the crack resistance in soldering becomes inferior due to an increase in absorption of moisture. When the amount of the inorganic filler exceeds 95% by weight of the total amount of the epoxy resin composition, there is the possibility that problems occur during molding such as wire sweep and pad shift.

The epoxy resin composition for sealing semiconductors of the present invention comprises zinc molybdate of component (E). In the composition of the present invention, zinc molybdate works as the fire retardant. By using zinc molybdate, the flame retarding property of the semiconductor device sealed with the resin composition comprising zinc molybdate is maintained and the long term reliability of the device in a humid condition is remarkably improved. It has been known that zinc molybdate is effective as an agent for suppressing smoke and as a fire retardant for vinyl chloride resins. However, zinc molybdate has never been applied to any materials for sealing semiconductors. It is known that zinc molybdate accelerates carbonation of components of cured resins. Therefore, the mechanism of fire retardation by zinc molybdate can be considered as follows: accelerated carbonation during burning suppresses contact of oxygen in the air with the composition and burning is stopped to achieve the fire retardation.

In the composition of the present invention, zinc molybdate may be used alone. However, it is preferable that zinc molybdate is used in the form coating an inorganic substance. Zinc molybdate has the tendency to absorb moisture. When zinc molybdate is used in a large amount, absorption of moisture by a semiconductor device increases and there is the possibility that crack resistance in soldering and reliability in a humid condition deteriorate. Therefore, it is preferable that an inorganic substance such as a transition metal, fused spherical silica, fused crushed silica, alumina clay, talc, zinc oxide, calcium carbonate, aluminum nitride, silicon nitride, aluminum silicate and magnesium silicate is used as a core material and the core material is coated with zinc molybdate. By using zinc molybdate in the form coating the inorganic substance, zinc molybdate at the surface alone works as the fire retardant and an increase in absorption of moisture by an increase in the amount of zinc molybdate can be suppressed.

Silica can be preferably used as the inorganic substance which is coated with zinc molybdate. Silica contains little impurities and there is no possibility that reliability in a humid condition deteriorates due to silica even when coating of silica with zinc molybdate is insufficient. Silica used herein is not particularly limited and any of crystalline silica and amorphous silica can be used. It is preferable that fused spherical silica is used. Addition of zinc molybdate in the form coating the core material of fused silica does not adversely affect various properties such as fluidity of the resin composition and mechanical strength of a cured product because fused spherical silica itself has excellent fluidity.

In the composition of the present invention, the amount of zinc molybdate coating fused spherical silica is preferably 5 to 40% by weight of the total amount of fused spherical silica and zinc molybdate. Particles obtained by coating fused spherical silica with zinc molybdate preferably have an average diameter of 0.5 to 50 $\mu$m and the maximum diameter of 100 $\mu$m or less. The content of zinc molybdate in the epoxy resin composition is preferably 0.05 to 20% by weight and more preferably 0.5 to 10% by weight of the total amount of the epoxy resin composition. When the content is less than 0.05% by weight, there is the possibility that a sufficient flame retarding property cannot be obtained. When the content exceeds 20% by weight, the amount of ionic impurities in the epoxy resin composition increases and there is the possibility that reliability in a humid condition, for example, in the condition of the pressure cooker test, becomes insufficient.

The process for coating fused spherical silica with zinc molybdate is not particularly limited. For example, fused spherical silica coated with zinc molybdate can be obtained in accordance with the following process: Molybdenum oxide and fused spherical silica are mixed together in water to prepare a slurry. The prepared slurry is heated at 70° C. and a slurry containing zinc oxide is slowly added to the heated slurry and mixed. The obtained mixture is stirred for about one hour. Then, the product is filtered to separate solid components. Water is removed from the solid components and the obtained product is pulverized. After incineration at 550° C. for 8 hours, fused spherical silica coated with zinc molybdate can be obtained. Inorganic substances coated with zinc molybdate are also commercially available, for example, from SHERWIN WILLIAMS Company.

In the epoxy resin composition for sealing semiconductors of the present invention, an ion scavenger can be used. The ion scavenger is not particularly limited. Compounds represented by one of the following formulae [4], [5] and [6] can be preferably used:

$$BiO_a(OH)_b(NO_3)_c \qquad [4]$$

$$BiO_d(OH)_e(NO_3)_f(HSiO_3)_g \qquad [5]$$

$$Mg_hAl_i(OH)_{2h+3i-2k}(CO_3)_k \cdot mH_2O \qquad [6]$$

In formula [4], a=0.9 to 1.1, b=0.6 to 0.8 and c=0 to 0.4. In formula [5], d=0.9 to 1.1, e=0.6 to 0.8 and f+g=0.2 to 0.4. In formula [6], 0<j/h≦1, 0≦k/j<1.5 and m represents a positive number.

Halogen anions and anions of organic acids can be scavenged by using the ion scavenger in the composition of the present invention and the amounts of ionic impurities which are brought into the composition with the resin components can be reduced. The ionic impurities corrode aluminum circuits and pads. The ionic impurities can be scavenged by the ion scavenger and corrosion of aluminum can be prevented. The ion scavenger may be used singly or as a combination of two or more types. The amount of the ion scavenger is preferably 0.1 to 5% by weight of the total amount of the epoxy resin composition. When the amount of the ion scavenger is less than 0.1% by weight of the total amount of the epoxy resin composition, scavenging of ionic impurities is insufficient and there is the possibility that reliability in a humid condition in an environmental test such as the pressure cooker test becomes insufficient. When the amount of the ion scavenger exceeds 5% by weight of the total amount of the epoxy resin composition, there is the possibility that the flame retarding property of the epoxy resin composition deteriorates.

To the epoxy resin composition for sealing semiconductors of the present invention, other additives may be added, where necessary. Examples of the other additives include silane coupling agents, coloring agents such as carbon black and iron oxide red, mold releases such as natural waxes and synthetic waxes and agents for decreasing stress such as silicone oils and rubber.

The process for producing the composition of the present invention is not particularly limited. For example, the epoxy resin of component (A), the phenol resin curing agent of component (B), the curing accelerator of component (C), the inorganic filler of component (D), zinc molybdate of component (E), the ion scavenger of component (F) and other additives are sufficiently mixed together by using a mixer or the like and then melt kneaded by using a heated roll or a kneader. The obtained product is cooled and pulverized. The epoxy resin composition for sealing semiconductors of the present invention can be applied to coating, insulation and sealing of electric and electronic parts such as transistors and integrated circuits by curing and molding in accordance with a molding process such as transfer molding, compression molding or injection molding.

EXAMPLES

The present invention will be described more specifically with reference to examples in the following. However, the present invention is not limited to the examples.

Abbreviations and structures of the epoxy resins, the phenol resin curing agents and the ion scavengers used in the examples and the comparative examples are shown together in the following.

(1) Epoxy Resins Derived from Biphenyl

YX4000K; manufactured by YUKA SHELL EPOXY Co., Ltd.; melting point, 105° C.; epoxy equivalent, 185 g/eq.

(2) Epoxy Resin 1

An epoxy resin expressed by formula [7].

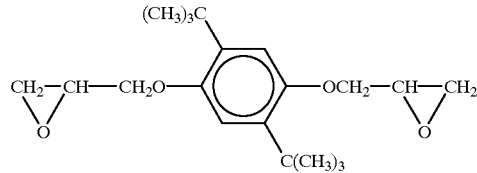

[7]

(3) Epoxy Resin 2

An epoxy resin expressed by formula [8].

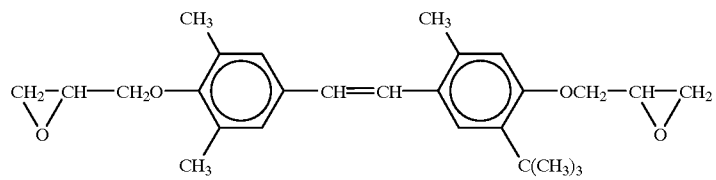

[8]

(4) Epoxy Resin Derived from O-cresol Novolak
Epoxy equivalent, 200 g/eq.

(5) Epoxy Resin 3

An epoxy resin containing a compound having the structure expressed by formula [9] as the main component; epoxy equivalent, 190 g/eq.

[9]

(6) Epoxy Resin 4

A mixture of 60% by weight of a resin containing a compound having the structure expressed by formula [10] as the main component and 40% by weight of a resin containing a compound having the structure expressed by formula [11] as the main component; epoxy equivalent, 210 g/eq.

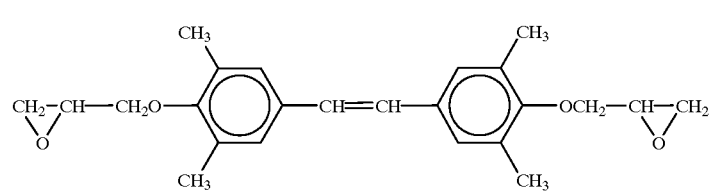

[10]

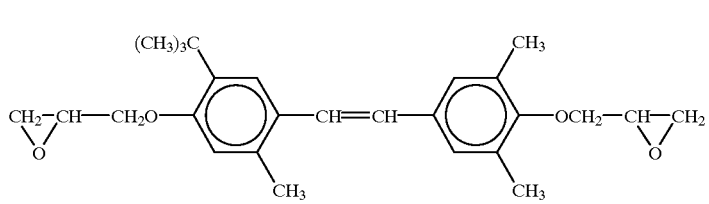

[11]

(7) Epoxy Resin 5

An epoxy resin containing a compound having the structure expressed by formula [12]; epoxy equivalent, 260 g/eq.

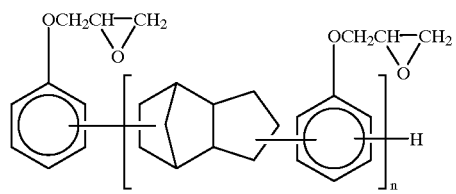

[12]

(8) Epoxy Resin 6

An epoxy resin containing a compound having the structure expressed by formula [13]; epoxy equivalent, 274 g/eq.

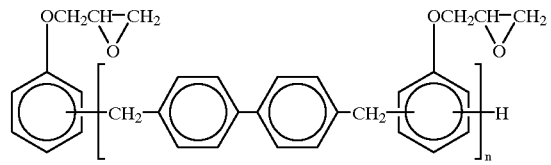

[13]

(9) Phenol Novolak Resin

Softening point, 95° C.; hydroxyl equivalent, 104 g/eq.

(10) Phenol Resin 1

A phenol resin expressed by formula [14]; hydroxyl equivalent, 175 g/eq.

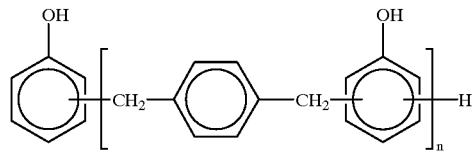

[14]

(11) Ion Scavenger 1

$BiO(OH)_{0.7}(NO_3)_f(HSiO_3)_g(f+g-0.3)$

(12) Ion Scavenger 2

A hydrotalcite compound; DHT-4H; manufactured by KYOWA KAGAKU KOGYO Co., Ltd.

The evaluations in the examples and in the comparative examples were conducted in accordance with the following methods:

(1) Glass Transition Temperature

A test piece for measuring the glass transition temperature was prepared by using a transfer molding machine in the condition of 175° C., 70 kg/cm² and 120 seconds. The test piece was post-cured at 175° C. for 8 hours. The test piece had a dimension of 15 mm×6 mm×3 mm. The measurement was carried out by using an apparatus for thermomechanical analysis. Heat expansion of the test piece was measured while the temperature was raised and the glass transition temperature was obtained from the result of the measurement.

(2) Flame Retarding Property

A test piece having a dimension of 127 mm×12.7 mm×1.6 mm was prepared by using a low pressure transfer machine in the condition of 175° C., 70 kg/cm² and 120 seconds. After the test piece was treated at 23° C. in a relative humidity of 50% for 48 hours, the flame retarding property was evaluated in accordance with the vertical method of UL94.

(3) High Temperatures Storage Life

Chip elements for test having a dimension of 3.0 mm×3.2 mm were sealed to 16 pDIP by using a low pressure transfer machine in the condition of 175° C., 70 kg/cm² and 120 seconds and then post-cured at 175° C. for 8 hours. The prepared semiconductor devices for test were kept in an atmosphere of 185° C. and electric resistance of these devices was measured at a prescribed time interval at a room temperature. The total number of the semiconductor device for test was 10. A device was regarded as defective when the electric resistance increased to a value twice the original value. The time passed before the total number of the defective device exceeded a half of the total number tested was regarded as the time of defect formation.

(4) Crack Resistance in Soldering

A chip element for test having a dimension of 0.9 mm×0.9 mm was sealed to 80 pQFP by using a low pressure transfer machine in the condition of 175° C., 70 kg/cm² and 120 seconds and then post-cured at 175° C. for 8 hours. The prepared semiconductor device was treated at 85° C. in a humidity of 85% and formation of cracks at the surface of the treated device was examined by observation under the IR reflow at 240° C.

(5) Reliability in a Humid Condition

A chip element for test having a dimension of 3.0 mm×3.5 mm was sealed to 16 pDIP by using a low pressure transfer machine in the condition of 175° C., 70 kg/cm² and 120 seconds. The prepared semiconductor device for test was subjected to the pressure cooker test at 125° C. in a relative humidity of 100%. The open defect of the circuit was measured and the time before the open defect took place was regarded as the reliability in a humid condition.

Example 1

The following components were mixed by using a super mixer at a room temperature:

| | parts by weight |
|---|---|
| Epoxy resin derived from biphenyl YX4000K; manufactured by YUKA SHELL EPOXY Co., Ltd.; melting point, 105° C.; epoxy equivalent, 185 g/eq. | 23.2 |
| Zinc molybdate zinc molybdate coating $3MgO \cdot SiO_2$; the amount of zinc molybdate coating the inorganic substance is shown. | 1.0 |
| Phenol novolak resin softening point, 95° C.; hydroxyl equivalent, 104 g/eq. | 13.0 |
| 1,8-Diazabicyclo[5,4,0]undecene-7 (hereinafter abbreviated as DBU) | 0.8 |
| Powder of fused spherical silica average particle diameter, 15 $\mu$m | 696 |
| Carbon black | 2.4 |
| Carnauba wax | 2.4 |

The prepared mixture was kneaded by a roll at 70 to 100° C. The kneaded mixture was then cooled and pulverized to obtain a resin composition. The obtained resin composition was formed into tablets and used for the evaluation.

The resin composition had a glass transition temperature of 138° C., a flame retarding property corresponding to V-0 of the UL specification and a high temperatures storage life of 1,200 hours. No cracks were found on the surface of any of six samples in the test of crack resistance in soldering.

Examples 2 to 7 Comparative Examples 1 and 2

Resin compositions were prepared and evaluated by using the formulations shown in Table 1 in accordance with the same procedures as those conducted in Example 4, the epoxy resin derived from hydroquinone which is expressed by formula [7] was used as the epoxy resin. In Example 5, the epoxy resin derived from stilbene which is expressed by formula [8] was used as the epoxy resin.

The results of the evaluation are shown in Table 1.

As shown in Table 1, the epoxy resin compositions of Example 1 to 7 and Comparative Example 1 and 2 all had the flame retarding property corresponding to V-0 of the UL specification. The epoxy resin compositions of Example 1 to 7 containing the fire retardant which was composed of zinc molybdate coating $3MgO \cdot SiO_2$ all showed high temperatures storage lives of 1,000 hours or more. In contrast, the epoxy resin compositions of Comparative Examples 1 and 2 containing the fire retardant a combination of antimony trioxide and brominated epoxy resin derived from bisphenol A showed high temperatures storage lives as low as 300 to 400 hours.

Example 8

The following components were mixed by using a super mixer at a room temperature:

| | parts by weight |
|---|---|
| Epoxy resin derived from o-cresol novolak epoxy equivalent, 200 g/eq. | 105 |
| Phenol novolak resin hydroxyl equivalent, 104 g/eq. | 55 |
| 1,8-Diazabicyclo[5,4,0]undecene-7 (abbreviated as DBU) | 3 |
| Fused spherical silica average particle diameter, 22 $\mu$m | 380 |
| Fused crushed silica average particle diameter, 15 $\mu$m | 300 |
| Fire retardant zinc molybdate coating fused spherical silica having an average particle diameter of 27 $\mu$m and a specific surface area of 4.0 $m^2/g$; 3 parts by weight of zinc molybdate per 7 parts by weight of fused spherical silica; (hereinafter referred to as fire retardant A) fire retardant A had an average particle diameter of 30 $\mu$m and the maximum particle diameter of 74 $\mu$m. | 150 |
| Carbon black | 2 |
| Carnauba wax | 5 |

The prepared mixture was kneaded by a roll at 70 to 100° C. The kneaded mixture was then cooled and pulverized to obtain a resin composition.

TABLE 1

| | Example | | | | | | | Comparative Example | |
|---|---|---|---|---|---|---|---|---|---|
| | 1 | 2 | 3 | 4 | 5 | 6 | 7 | 1 | 2 |
| epoxy resin derived from biphenyl | 23.2 | 23.2 | 23.2 | — | — | 23.2 | 23.2 | 21.7 | 21.7 |
| epoxy resin 1 (formula [7]) | — | — | — | 22.2 | — | — | — | — | — |
| epoxy resin 2 (formula [8]) | — | — | — | — | 26.4 | — | — | — | — |
| zinc molybdate | 1.0 | 2.0 | 4.0 | 1.0 | 1.0 | 1.0 | 1.0 | — | — |
| ion scavenger 1 | — | — | — | — | — | 3.7 | — | — | — |
| ion scavenger 2 | — | — | — | — | — | — | 3.7 | — | 3.7 |
| phenol novolak resin | 13.0 | 13.0 | 13.0 | 13.0 | 13.0 | 13.0 | 13.0 | 13.0 | 13.0 |
| antimony trioxide | — | — | — | — | — | — | — | 2.2 | 2.2 |
| brominated epoxy resin derived from bisphenol A | — | — | — | — | — | — | — | 2.8 | 2.8 |
| DBU | 0.8 | 0.8 | 0.8 | 0.8 | 0.8 | 0.8 | 0.8 | 0.8 | 0.8 |
| fused spherical silica (average particle diameter, 15 $\mu$m) | 696 | 696 | 696 | 696 | 696 | 696 | 696 | 696 | 696 |
| carbon black | 2.4 | 2.4 | 2.4 | 2.4 | 2.4 | 2.4 | 2.4 | 2.4 | 2.4 |
| carnauba wax | 2.4 | 2.4 | 2.4 | 2.4 | 2.4 | 2.4 | 2.4 | 2.4 | 2.4 |
| glass transition temperature | 138 | 139 | 136 | 131 | 132 | 137 | 135 | 134 | 136 |
| flame retarding property | V-0 | V-0 | V-0 | V-0 | V-0 | V-0 | V-0 | V-0 | V-0 |
| high temperatures storage life (hour) | 1200 | 1300 | 1300 | 1100 | 1000 | 1300 | 1300 | 300 | 400 |
| crack resistance in soldering | 0/6 | 0/6 | 0/6 | 0/6 | 0/6 | 0/6 | 0/6 | 0/6 | 1/6 |

The obtained resin composition had a flame retarding property corresponding to V-0 of the UL specification and a reliability in a humid condition of 500 hours.

Examples 9 to 16 and Comparative Examples 3 to 7

Resin compositions were prepared and evaluated by using the formulations shown in Tables 2 and 3 in accordance with the same procedures as those conducted in Example 8. The results are shown in Tables 2 and 3.

In Comparative Example 7, fused spherical silica having an average particle diameter of 27 μm and a specific surface area of 4.0 m²/g was used.

TABLE 2

|  | Example | | | | | | | | |
| --- | --- | --- | --- | --- | --- | --- | --- | --- | --- |
|  | 8 | 9 | 10 | 11 | 12 | 13 | 14 | 15 | 16 |
| epoxy resin derived from o-cresol novolak | 105 | 79 | 64 | — | — | — | — | — | — |
| epoxy resin 3 (formula [9]) | — | — | — | 52 | — | — | — | 52 | 52 |
| epoxy resin 4 (formulae [10] + [11]) | — | — | — | — | 55 | — | — | — | — |
| epoxy resin 5 (formula [12]) | — | — | — | — | — | 86 | — | — | — |
| epoxy resin 6 (formula [13]) | — | — | — | — | — | — | 73 | — | — |
| phenol novolak resin | 55 | 41 | — | — | — | 34 | — | — | — |
| phenol resin 1 (formula [14]) | — | — | 56 | 48 | 45 | — | 47 | 48 | 48 |
| DBU | 3 | 3 | 3 | 3 | 3 | 3 | 3 | 3 | 3 |
| fused spherical silica (average particle diameter, 22 μm) | 380 | 770 | 770 | 840 | 840 | 750 | 850 | 860 | 860 |
| fused crushed silica (average particle diameter, 15 μm) | 300 | — | — | — | — | — | — | — | — |
| fire retardant A | 150 | 100 | 100 | 50 | 50 | 120 | 20 | 20 | 20 |
| fire retardant B | — | — | — | — | — | — | — | — | — |
| ion scavenger 1 | — | — | — | — | — | — | — | 10 | — |
| ion scavenger 2 | — | — | — | — | — | — | — | — | 10 |
| carbon black | 2 | 2 | 2 | 2 | 2 | 2 | 2 | 2 | 2 |
| carnauba wax | 5 | 5 | 5 | 5 | 5 | 5 | 5 | 5 | 5 |
| flame retarding property | V-0 | V-0 | V-0 | V-0 | V-0 | V-0 | V-0 | V-0 | V-0 |
| reliability in a humid condition (hour) | 500 | 500 | 480 | 450 | 450 | 400 | 500 | 500 | 500 |

TABLE 3

|  | Comparative Example | | | | |
| --- | --- | --- | --- | --- | --- |
|  | 3 | 4 | 5 | 6 | 7 |
| epoxy resin derived from o-cresol novolak | 105 | 79 | 89 | — | 79 |
| epoxy resin 3 (formula [9]) | — | — | — | 63 | — |
| phenol novolak resin | 55 | 41 | 51 | — | 41 |
| phenol resin 1 (formula [14]) | — | — | — | 57 | — |
| DBU | 3 | 3 | 3 | 3 | 3 |
| fused spherical silica (average particle diameter, 22 μm) | 380 | 870 | 370 | 870 | 770 |
| fused crushed silica (average particle diameter, 15 μm) | 450 | — | 450 | — | — |
| fused spherical silica (average particle diameter, 15 μm; specific surface area, 4.0 m²/g) | — | — | — | — | 100 |
| carbon black | 2 | 2 | 2 | 2 | 2 |
| carnauba wax | 5 | 5 | 5 | 5 | 5 |
| antimony trioxide | — | — | 20 | — | — |
| brominated epoxy resin derived from bisphenol A | — | — | 10 | — | — |

TABLE 3-continued

|  | Comparative Example | | | | |
| --- | --- | --- | --- | --- | --- |
|  | 3 | 4 | 5 | 6 | 7 |
| flame retarding property | burned completely | V-2 | V-0 | V-1 | V-2 |
| reliability in a humid condition (hour) | 500 | 500 | 500 | 450 | 500 |

As shown in Table 2, the epoxy resin compositions of Examples 8 to 16 containing fire retardant A, which was composed of fused spherical silica having an average particle diameter of 27 μm and a specific surface area of 4.0 m²/g and zinc molybdate coating the fused spherical silica, the amount of zinc molybdate being 3 parts by weight per 7 parts by weight of the fused spherical silica, showed the excellent properties, i.e., V-0 of the UL specification and a reliability in a humid condition of 500 hours, although these epoxy resin compositions did not contain either antimony compounds or bromine compounds. These properties are as excellent as those of the epoxy resin composition of Comparative Example 5 containing antimony trioxide and a brominated epoxy resin derived from bisphenol A. In contrast, none of the epoxy resin compositions of Comparative Examples 3, 4, 6 and 7 containing no zinc molybdate satisfied the requirements of V-0 of the UL specification.

Industrial Applicability

Semiconductor devices exhibiting excellent flame retarding property, high temperatures storage life, crack resistance in soldering and reliability in a humid condition can be obtained by sealing semiconductor elements with the epoxy resin composition of the present invention.

What is claimed is:

1. An epoxy resin composition for sealing semiconductors which comprises (A) an epoxy resin, (B) a phenol resin curing agent, (C) a curing accelerator, (D) an inorganic filler and (E) zinc molybdate as essential components.

2. An epoxy resin composition for sealing semiconductors according to claim 1, wherein zinc molybdate coats an inorganic substance.

3. An epoxy resin composition for sealing semiconductors according to claim 2, wherein the inorganic substance is fused spherical silica.

4. An epoxy resin composition for sealing semiconductors according to claim 1, wherein the epoxy resin is a crystalline epoxy resin represented by the following formula [1], [2] or [3]:

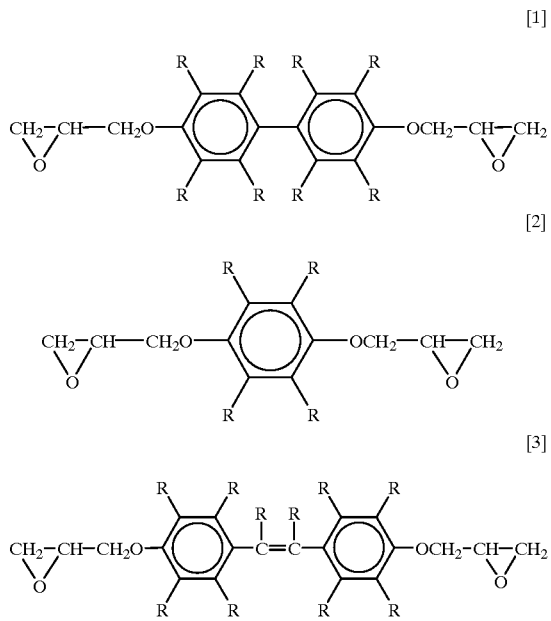

wherein R represents hydrogen atom, a halogen atom or an alkyl group having 1 to 12 carbon atoms and the plurality of R may be the same with or different from each other.

5. An epoxy resin composition for sealing semiconductors according to claim 2, wherein the epoxy resin is a crystalline epoxy resin represented by the following formula [1], [2] or [3]:

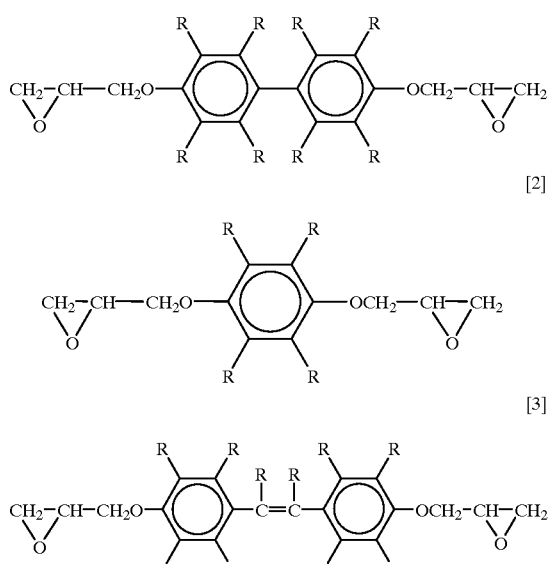

wherein R represents hydrogen atom, a halogen atom or an alkyl group having 1 to 12 carbon atoms and the plurality of R may be the same with or different from each other.

6. An epoxy resin composition for sealing semiconductors according to claim, 3, wherein the epoxy resin is a crystalline epoxy resin represented by the following formula [1], [2] or [3]:

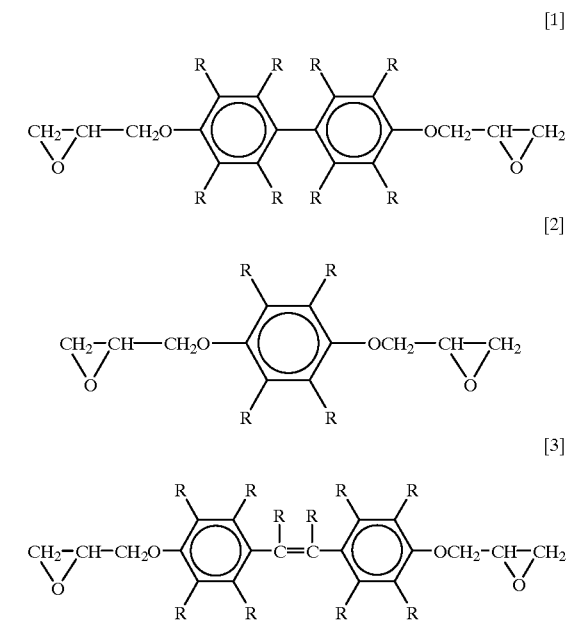

wherein R represents hydrogen atom, a halogen atom or an alkyl group having 1 to 12 carbon atoms and the plurality of R may be the same with or different from each other.

7. An epoxy resin composition for sealing semiconductors according to claim 1, which further comprises an ion scavenger represented by one of the following formulae [4], [5] and [6]:

$$BiO_a(OH)_b(NO_3)_c \qquad [4]$$

wherein a=0.9 to 1.1, b=0.6 to 0.8 and c=0 to 0.4;

$$BiO_d(OH)_e(NO_3)_f(HSiO_3)_g \qquad [5]$$

wherein d=0.9 to 1.1, e=0.6 to 0.8 and f+g=0.2 to 0.4;

$$Mg_hAl_i(OH)_{2h+3i-2k}(CO_3)_k \cdot mH_2O \qquad [6]$$

wherein $0<j/h\leq 1$, $0\leq k/j<1.5$ and m represents a positive number.

8. An epoxy resin composition for sealing semiconductors according to claim 2, which further comprises an ion scavenger represented by one of the following formulae [4], [5] and [6]:

$$BiO_a(OH)_b(NO_3)_c \qquad [4]$$

wherein a=0.9 to 1.1, b=0.6 to 0.8 and c=0 to 0.4;

$$BiO_d(OH)_e(NO_3)_f(HSiO_3)_g \qquad [5]$$

wherein d=0.9 to 1.1, e=0.6 to 0.8 and f+g=0.2 to 0.4;

$$Mg_hAl_i(OH)_{2h+3i-2k}(CO_3)_k \cdot mH_2O \qquad [6]$$

wherein $0<j/h\leq 1$, $0\leq k/j<1.5$ and m represents a positive number.

9. An epoxy resin composition for sealing semiconductors according to claim 3, which further comprises an ion scavenger represented by one of the following formulae [4], [5] and [6]:

$$BiO_a(OH)_b(NO_3)_c \qquad [4]$$

wherein a=0.9 to 1.1, b=0.6 to 0.8 and c=0 to 0.4;

$$BiO_d(OH)_e(NO_3)_f(HSiO_3)_g \qquad [5]$$

wherein d=0.9 to 1.1, e=0.6 to 0.8 and f+g=0.2 to 0.4;

$$Mg_hAl_i(OH)_{2h+3i-2k}(CO_3)_k \cdot mH_2O \qquad [6]$$

wherein $0<j/h\leq 1$, $0\leq k/j<1.5$ and m represents a positive number.

10. An epoxy resin composition for sealing semiconductors according to claim 4, which further comprises an ion scavenger represented by one of the following formulae [4], [5] and [6]:

$$BiO_a(OH)_b(NO_3)_c \qquad [4]$$

wherein a=0.9 to 1.1, b=0.6 to 0.8 and c=0 to 0.4;

$$BiO_d(OH)_e(NO_3)_f(HSiO_3)_g \qquad [5]$$

wherein d=0.9 to 1.1, e=0.6 to 0.8 and f+g=0.2 to 0.4;

$$Mg_hAl_i(OH)_{2h+3i-2k}(CO_3)_k \cdot mH_2O \qquad [6]$$

wherein $0<j/h\leq 1$, $0\leq k/j<1.5$ and m represents a positive number.

11. An epoxy resin composition for sealing semiconductors according to claim 5, which further comprises an ion scavenger represented by one of the following formulae [4], [5] and [6]:

$$BiO_a(OH)_b(NO_3)_c \qquad [4]$$

wherein a=0.9 to 1.1, b=0.6 to 0.8 and c=0 to 0.4;

$$BiO_d(OH)_e(NO_3)_f(HSiO_3)_g \qquad [5]$$

wherein d=0.9 to 1.1, e=0.6 to 0.8 and f+g=0.2 to 0.4;

$$Mg_hAl_i(OH)_{2h+3i-2k}(CO_3)_k \cdot mH_2O \qquad [6]$$

wherein $0<j/h\leq 1$, $0\leq k/j<1.5$ and m represents a positive number.

12. An epoxy resin composition for sealing semiconductors according to claim 6, which further comprises an ion scavenger represented by one of the following formulae [4], [5] and [6]:

$$BiO_a(OH)_b(NO_3)_c \qquad [4]$$

wherein a=0.9 to 1.1, b=0.6 to 0.8 and c=0 to 0.4;

$$BiO_d(OH)_e(NO_3)_f(HSiO_3)_g \qquad [5]$$

wherein d=0.9 to 1.1, e=0.6 to 0.8 and f+g=0.2 to 0.4;

$$Mg_hAl_i(OH)_{2h+3i-2k}(CO_3)_k \cdot mH_2O \qquad [6]$$

wherein $0<j/h\leq 1$, $0\leq k/j<1.5$ and m represents a positive number.

13. A semiconductor device sealed with an epoxy resin composition for sealing semiconductors described in claim 1.

14. A semiconductor device sealed with an epoxy resin composition for sealing semiconductors described in claim 2.

15. A semiconductor device sealed with an epoxy resin composition for sealing semiconductors described in claim 3.

16. A semiconductor device sealed with an epoxy resin composition for sealing semiconductors described in claim 4.

17. A semiconductor device sealed with an epoxy resin composition for sealing semiconductors described in claim 5.

18. A semiconductor device sealed with an epoxy resin composition for sealing semiconductors described in claim 6.

19. A semiconductor device sealed with an epoxy resin composition for sealing semiconductors described in claim 7.

20. A semiconductor device sealed with an epoxy resin composition for sealing semiconductors described in claim 8.

21. A semiconductor device sealed with an epoxy resin composition for sealing semiconductors described in claim 9.

22. A semiconductor device sealed with an epoxy resin composition for sealing semiconductors described in claim 10.

23. A semiconductor device sealed with an epoxy resin composition for sealing semiconductors described in claim 11.

24. A semiconductor device sealed with an epoxy resin composition for sealing semiconductors described in claim 12.

* * * * *